(12) United States Patent
Kim et al.

(10) Patent No.: US 7,549,781 B2
(45) Date of Patent: Jun. 23, 2009

(54) LIGHT EMITTING DIODE AND LENS FOR THE SAME

(75) Inventors: Gi-Cherl Kim, Yongin-si (KR); Chun-Ho Song, Seoul (KR); Sang-Gil Lee, Seoul (KR); Jong-Seo Lee, Hwaseong-si (KR); Sang-Yu Lee, Yongin-si (KR); Ju-Young Yoon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 80 days.

(21) Appl. No.: 11/222,962

(22) Filed: Sep. 12, 2005

(65) Prior Publication Data

US 2006/0091429 A1    May 4, 2006

(30) Foreign Application Priority Data

Nov. 3, 2004    (KR)    ............ 10-2004-0088811

(51) Int. Cl.
*H01L 33/00* (2006.01)
(52) U.S. Cl. ............. 362/555; 362/326; 362/311; 362/800
(58) Field of Classification Search ............ 362/311, 362/317, 555, 800, 326, 332–336, 328, 329; 359/638, 726; 257/98; 313/113
See application file for complete search history.

(56) References Cited

U.S. PATENT DOCUMENTS

| | | | | |
|---|---|---|---|---|
| 2,254,962 A | * | 9/1941 | Bitner et al. | ............ 362/327 |
| 2,908,197 A | * | 10/1959 | Wells et al. | ............ 340/815.76 |
| 4,638,343 A | | 1/1987 | Althaus et al. | |
| 5,813,743 A | * | 9/1998 | Naka | ............ 362/16 |
| 5,825,051 A | | 10/1998 | Bauer et al. | |
| 5,865,529 A | * | 2/1999 | Yan | ............ 362/327 |
| 6,236,382 B1 | | 5/2001 | Kawakami et al. | |
| 6,598,998 B2 | | 7/2003 | West et al. | |
| 6,606,135 B2 | * | 8/2003 | Nakanishi et al. | ............ 349/95 |
| 6,607,286 B2 | * | 8/2003 | West et al. | ............ 362/255 |
| 6,674,096 B2 | * | 1/2004 | Sommers | ............ 257/98 |
| 6,809,470 B2 | | 10/2004 | Morley et al. | |
| 6,819,505 B1 | * | 11/2004 | Cassarly et al. | ............ 359/726 |

(Continued)

FOREIGN PATENT DOCUMENTS

EP    117606 A1 *    9/1984

(Continued)

*Primary Examiner*—Anabel Ton
*Assistant Examiner*—Kevin Spinella
(74) *Attorney, Agent, or Firm*—Cantor Colburn LLP

(57) ABSTRACT

A light emitting diode includes a lens, a chip base attached to a bottom of the lens, and an LED chip attached in the chip base to be concentric with the lens. The lens includes a bottom, an outer sidewall extending from the bottom, a first outer top surface extending from the outer sidewall, a second outer top surface extending from the first outer top surface and having a substantially conical groove-like shape, an inner sidewall forming a side of a central cavity formed by hollowing a central portion of the bottom, and an inner top surface extending from the inner sidewall and forming a ceiling of the central cavity. The substantially conical groove-like shaped second outer top surface has an angular point formed toward the central cavity, and the inner top surface is convexly formed toward the bottom.

21 Claims, 6 Drawing Sheets

U.S. PATENT DOCUMENTS

| | | | |
|---|---|---|---|
| 6,981,775 B2 * | 1/2006 | Tenmyo | 362/16 |
| 7,091,652 B2 | 8/2006 | Morley et al. | |
| 7,168,839 B2 * | 1/2007 | Chinniah et al. | 362/555 |
| 7,401,948 B2 * | 7/2008 | Chinniah et al. | 362/326 |
| 2002/0080615 A1 * | 6/2002 | Marshall et al. | 362/333 |
| 2002/0084952 A1 | 7/2002 | Morley et al. | |
| 2004/0012976 A1 * | 1/2004 | Amano | 362/511 |
| 2004/0141323 A1 * | 7/2004 | Aynie et al. | 362/308 |
| 2004/0239236 A1 | 12/2004 | Morley et al. | |
| 2004/0252390 A1 * | 12/2004 | Benitez et al. | 359/858 |

FOREIGN PATENT DOCUMENTS

| | | |
|---|---|---|
| JP | 05183194 | 7/1993 |
| JP | 09018058 | 1/1997 |
| JP | 2003008068 | 1/2003 |
| JP | 2003008081 | 1/2003 |
| JP | 2003060238 | 2/2003 |
| JP | 2003218408 | 7/2003 |
| JP | 2003332630 | 11/2003 |
| KR | 19980087151 | 12/1998 |
| KR | 1020010097905 A1 | 11/2001 |
| KR | 102004020873 | 3/2004 |

\* cited by examiner

LIGHT EMITTING DIODE AND LENS FOR THE SAME

CROSS REFERENCE TO RELATED APPLICATION

This application claims priority to and the benefit of Korean Patent Application No. 10-2004-0088811 filed on Nov. 3, 2004 which is hereby incorporated by reference for all purposes as if fully set forth herein.

BACKGROUND OF THE INVENTION

1. Field of the Invention

The present invention relates to a light source for a display device.

2. Description of the Related Art

Display devices such as television receivers or computer monitors are classified as either a self-luminescence display capable of self-emitting or a light-receiving display requiring a separate light source. The self-emissive display device may be a light emitting diode (LED), an electroluminescence (EL), a vacuum fluorescent display (VFD), a field emission display (FED), or a plasma display panel (PDP). The light receiving display device may be a liquid crystal display (LCD) device.

Generally, the LCD includes a pair of panels having electrodes on their inner surfaces, and a dielectric anisotropy liquid crystal layer interposed between the panels. Varying voltage difference between field generating electrodes, e.g., a variation in the strength of an electric field generated by the electrodes, changes the transmittance of the light passing through the LCD to display a desired image.

In the LCD, the light may be natural light or an artificial light emitted from a light source that is separately employed in the LCD.

A backlight generally provides the artificial light to the LCD. The backlight uses light emitting diodes (LEDs) or fluorescent lamps such as cold cathode fluorescent lamps (CCFLs), external electrode fluorescent lamps (EEFLs), etc. as the light source.

The LED is eco-friendly because it does not use mercury (Hg) and it has a longer working lifetime than most other light sources. Further, the LED exhibits good color reproducibility.

However, the light emitted from the LED is typically condensed or focused to a very narrow area. For applying such an LED to a surface light source. Therefore, a technique for distributing the light from the LED to a wider region may be necessary to use the LED as a surface light source.

SUMMARY OF THE INVENTION

The present invention provides substantially uniform light distribution to an LCD by a backlighting system using LEDs. The present invention utilizes a lens capable of distributing light toward its side.

Additional features of the invention will be set forth in the description which follows, and in part will be apparent from the description, or may be learned by practice of the invention.

The present invention discloses a lens for a light emitting diode, including: a bottom; an outer sidewall extending from the bottom; a first outer top surface extending from the outer sidewall; a second outer top surface extending from the first outer top surface and having a substantially conical groove like shape; an inner sidewall delimiting a side of a cavity; and an inner top surface extending from the inner sidewall and forming a ceiling for the cavity, wherein the second outer top surface has an angular point that points toward the cavity and the inner top surface is convexly formed toward the bottom.

The present invention further discloses a lens for a light emitting diode, including: a bottom; an outer sidewall extending from the bottom; an outer top surface extending from the outer sidewall and having like a substantially conical groove like shape: an inner sidewall forming a side of a cavity; and an inner top surface extending from the inner sidewall and forming a ceiling for the cavity, wherein the outer top surface has an angular point that points toward the cavity and the inner top surface has a cone like shape convexly formed toward the bottom.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention

DESCRIPTION OF THE ILLUSTRATED EMBODIMENTS

Figure 1:
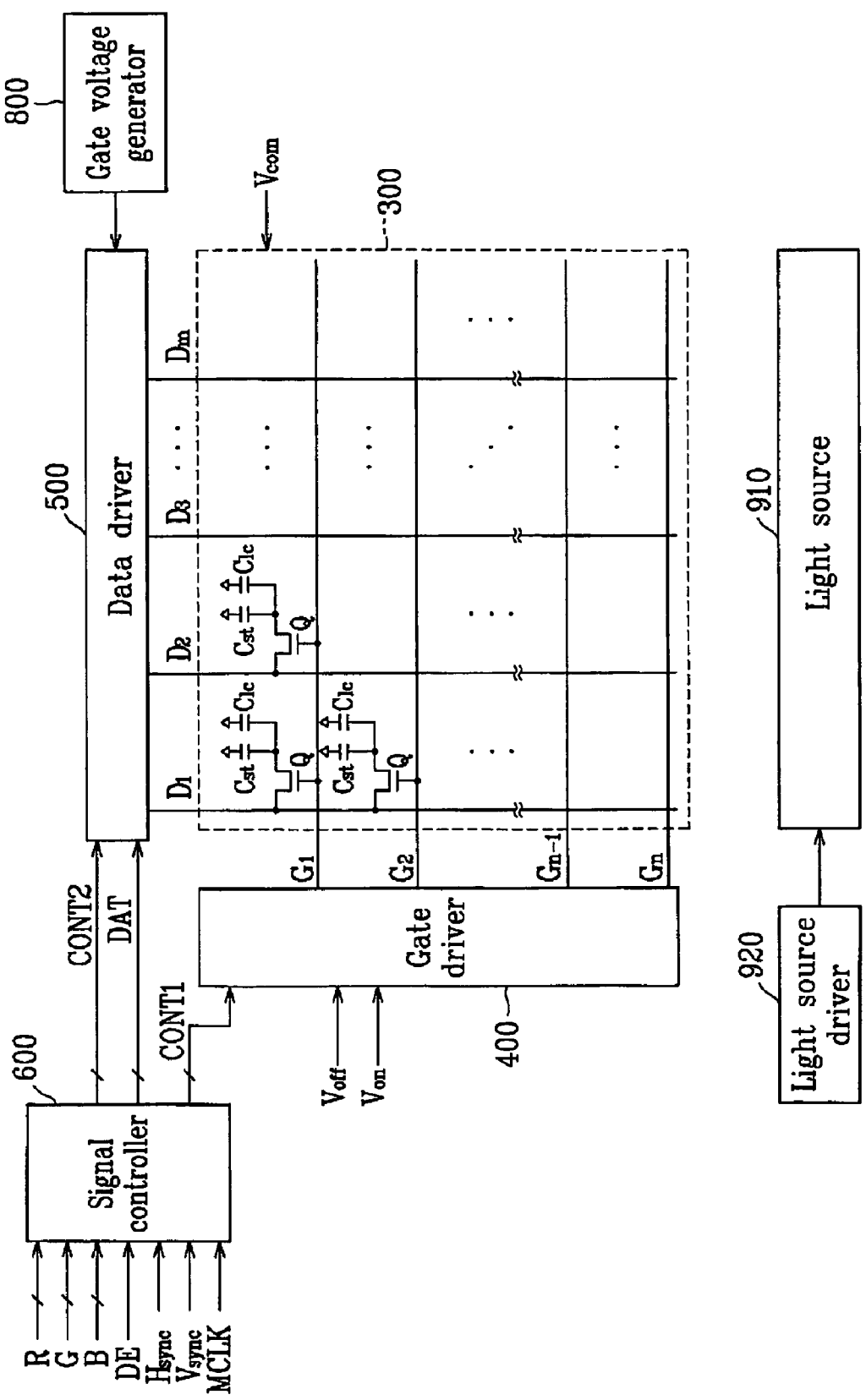
FIG. 1 is a block view of an LCD according to an embodiment of the invention.

Preferred embodiments of the present invention are described more fully below with reference to the accompanying drawings, in which embodiments of the invention are shown. The present invention may be embodied in different forms and is not to be construed as being limited to the embodiments set forth herein. Rather, these embodiments are provided so that this disclosure is thorough and fully conveys the scope of the invention to those of skill in the art.

In the drawings, the thickness of the layers, films, and regions are exaggerated for clarity. Like numerals refer to like elements throughout. It is understood that when an element such as a layer, film, region, or substrate is referred to as being "on" another element, the element can be directly on the other element or intervening elements may also be present.

Hereinafter, a driving system of a light source device for a display device according to embodiments of the invention are described with reference to the accompanying drawings.

Figure 2:
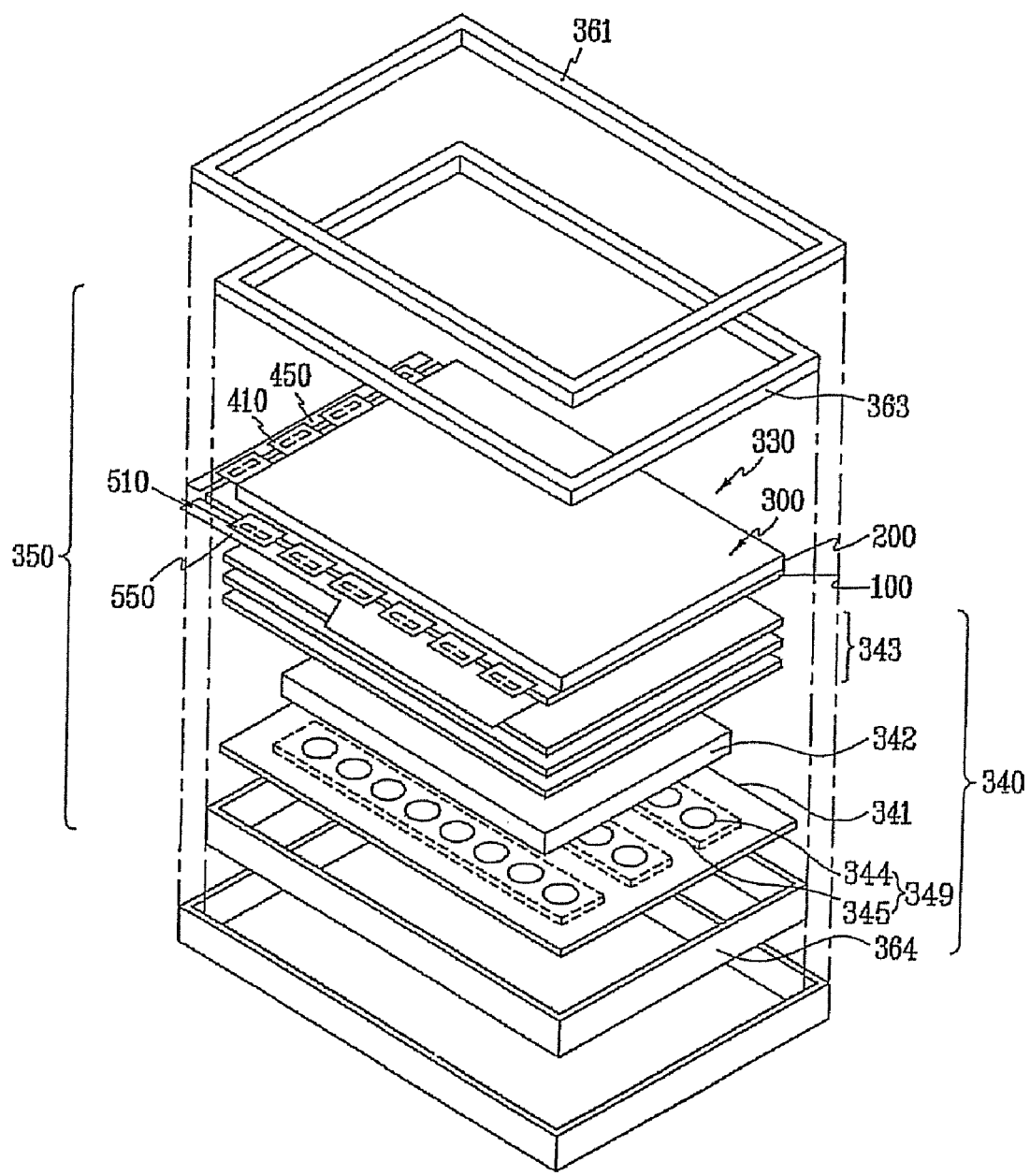
FIG. 2 is an exploded perspective view schematically illustrating an LCD according to an embodiment of the invention.
Figure 3:
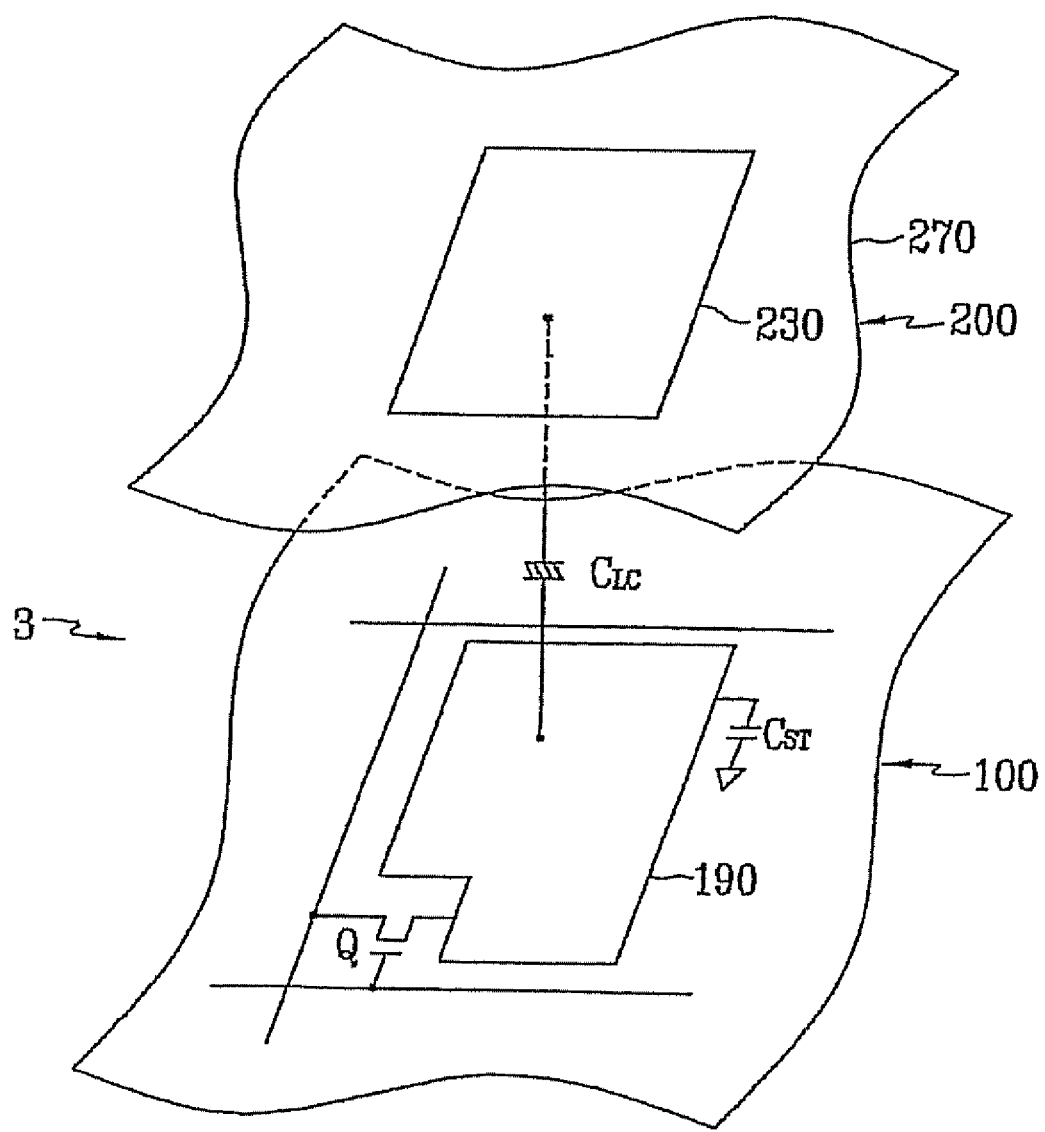
FIG. 3 is an equivalent circuit view of a pixel unit of an LCD according to an embodiment of the invention.

FIG. 1 is a block diagram of an LCD according to an embodiment of the invention. FIG. 2 is an exploded perspective view schematically showing an LCD according to an embodiment of the invention. FIG. 3 is an equivalent circuit view of a pixel unit of an LCD according to an embodiment of the invention.

Referring to FIG. 1, an LCD may include an LC panel assembly 300, a gate driver 400, and a data driver 500 which are connected with the LC panel assembly 300, a gray voltage generator 800 that is connected with the data driver 400, a light source section 910 that supplies light to the LC panel assembly 300, a light source driver 920 that controls the light source section 910, and a signal controller 600 that controls the above elements.

Referring to the embodiment shown in FIG. 2, the LCD includes an LC module 350 including a display unit 330 and a backlight 340, a front housing 361 and a rear housing 364 for receiving and supporting the LC module 350, and mold frames 363 and 364.

The display unit 330 includes the LC panel assembly 300, a gate tape carrier package (TCP) 410, and a data TCP 510, which are attached with the LC panel assembly 300, and a gate printed circuit board (PCB) 450 and a data PCB 550 which are attached with the corresponding TCPs 410 and 510, respectively.

According to the structure shown in FIG. 2 and FIG. 3, the LC panel assembly 300 includes a lower panel 100 and an upper panel 200 facing each other, and an LC layer 3 provided therebetween. In an equivalent circuit shown in FIG. 1 and FIG. 3, the LC panel assembly 300 includes a plurality of display signal lines $G_1$-$G_n$ and $D_1$-$D_m$ and a plurality of pixels connected thereto and arranged substantially in a matrix or array point.

The display signal lines $G_1$-$G_n$ and $D_1$-$D_m$ are provided on the lower panel 100 and include a plurality of gate lines $G_1$-$G_n$ to transmit gate signals (also referred to as "scanning signals"), and a plurality of data lines $D_1$-$D_m$ to transmit data signals. The gate lines $G_1$-$G_n$ extend substantially in a row direction and are substantially parallel to each other. The data lines $D_1$-$D_m$ extend substantially in a column direction and are substantially parallel to each other.

Each pixel includes a switching element Q which is connected with the display signal lines $G_1$-$G_n$ and $D_1$-$D_m$, and an LC capacitor $C_{LC}$ and a storage capacitor $C_{ST}$ which are connected with the switching element Q. The storage capacitor $C_{ST}$ may be omitted as necessary.

The switching element Q such as a thin film transistor (TFT) is provided on the lower panel 100 and may include three terminals: a control terminal connected with one of the gate lines $G_1$-$G_n$; an input terminal connected with one of the data lines $D_1$-$D_m$; and an output terminal connected with both of the LC capacitor $C_{LC}$ and the storage capacitor $C_{ST}$.

The LC capacitor $C_{LC}$ may include a pixel electrode 190 provided on the lower panel 100 and a common electrode 270 provided on the upper panel 200. The LC layer 3 is provided between the pixel electrode 190 and the common electrode 270 and operates as a dielectric of the LC capacitor $C_{LC}$. The pixel electrode 190 is connected with the switching element Q. The common electrode 270 is supplied with a common voltage $V_{com}$ and covers an entire surface of the upper panel 200. Unlike the embodiment shown in FIG. 3, the common electrode 270 may be provided on the lower panel 100. At least one of the pixel electrode 190 and the common electrode 270 may be shaped as a substantially bar shape or a substantially stripe shape.

The storage capacitor $C_{ST}$ is an auxiliary capacitor for the LC capacitor $C_{LC}$. When the pixel electrode 190 and a separate signal line (not shown) which is provided on the lower panel 100 overlap or cross each other and an insulator is provided therebetween, the overlap portion operates as the storage capacitor $C_{ST}$. The separate signal line is supplied with a predetermined voltage such as the common voltage $V_{com}$. Alternately, the storage capacitor $C_{ST}$ may be formed by overlapping the pixel electrode 10 and a previous gate line which is placed directly before or prior to the pixel electrode 190, interposing an insulator therebetween.

According to an embodiment of the invention, when displaying color, each pixel exhibits one of three primary colors (i.e., spatial division), or sequentially exhibits three primary colors in turn depending on time (i.e., temporal division), so that a spatial or temporal sum of the primary colors is recognized as a desired color. FIG. 3 is an embodiment of the spatial division where each pixel includes a color filter 230 for exhibiting one of the primary colors in an area of the upper panel 200 corresponding to the pixel electrode 190. Unlike FIG. 3, the color filter 230 may be provided on or under the pixel electrode 190 of the lower panel 100.

Referring to FIG. 2, the backlight 340 is mounted or attached under the LC panel assembly 300. The backlight 340 includes a light source unit 349 having a plurality of light emitting diodes (LEDs) 344 arranged in a matrix or array like format on a printed circuit board (PCB) 345, a light guiding plate 342, and a plurality of optical sheets 343 provided between the LC panel assembly 300 and the LEDs 344 to disperse or spread the light emitted from the LEDs 344 to the LC panel assembly 300. The backlight 340 may further include a reflecting plate 341 placed over the PCB 345 having a plurality of holes with light emitting chips of the LEDs 344 protruding or extending therethrough to reflect the light emitted from the LEDs 344 toward the LC panel assembly 300.

The backlight 340 may further include a mold frame 364 positioned between the reflecting plate 341 and the light guiding plate 342 to maintain a regular interval or space between the light source unit 349 and the light guiding plate 342 and to support the light guiding plate 342 and the optical sheets 343.

The LEDs 344 as the light source may utilize only white LEDs emitting white light, or instead may utilize a mixed array of red, green, and blue LEDs, or a mixed array of white and red LEDs. When the mixed array of white and red LEDs is utilized, the red LED functions as an auxiliary of the white LED. These LEDs are arranged on the PCB 345 in a predetermined arrangement, thereby forming the light source unit 349.

FIG. 2 shows three light source units 349, but the number of light source units 349 may be controlled depending on the required brightness and the size of the LCD screen.

Polarizers (not shown) may be provided on the outer surfaces of the two panels 100 and 200 to polarize the light emitted from the light source units 349.

Referring to FIG. 1 and FIG. 2, the gray voltage generator 800 is included in the data PCB 550, and it generates two sets of a plurality of gray voltages related to the transmittance of the pixels. The gray voltages in one set have a positive polarity with respect to the common voltage $v_{com}$, while the gray voltages in the other set have a negative polarity with respect to the common voltage $v_{com}$.

The gate drivers 400 may be individually mounted on each gate TCP 410, having the shape of an integrated circuit (IC) chip, and are individually coupled or connected with the gate lines $G_1$-$G_n$ of the LC panel assembly 300 to transmit the gate signals consisting of combinations of the gate-on voltage $V_{on}$ and the gate-off voltage $V_{off}$ input from an external device to the gate signal lines $G_1$-$G_n$.

The data drivers 500 may be individually mounted or attached on each data TCP 510, having the shape of an IC chip, and are individually connected with the data lines $D_1$-$D_m$ of the LC panel assembly 300 to transmit the data voltages which are selected from the gray voltages supplied from the gray voltage generator 800, to the data signal lines $D_1$-$D_m$.

In another embodiment of the invention, the gate driver 400 or the data driver 500 is directly mounted on the lower panel 100 having the shape of an IC chip. In still another embodiment of the invention, the gate driver 400 or the data driver 500 is integrated into the lower panel 10 along with the other elements. In each of the above described embodiments, the gate PCB 450 or the gate TCP 410 may be omitted as necessary.

The signal controller 600 may be included in the data PCB 550 or the gate PCB 450 to control the gate driver 400 or the data driver 500, respectively.

The operation of the above-described LCD is described below in detail.

The signal controller 600 receives input image signals R, G, and B and input control signals for controlling the display thereof, such as a vertical synchronizing signal $V_{sync}$, a horizontal synchronizing signal $H_{sync}$ a main clock MCLK, a data enable signal DE, etc, from an external graphic controller (not shown). In response to the input image signals R, G, and B and the input control signals, the signal controller 600 processes the image signals R, G, and B to operate the LC panel assembly 300 and generates and outputs gate control signals CONT1 and data control signals CONT2, to the gate driver 400 and the data driver 500, respectively.

The gate control signals CONT1 may include a vertical synchronizing start signal STV that informs or marks the beginning or start of a frame, a gate clock signal CPV that controls the output time of the gate-on voltage $V_{on}$, and an output enable signal OE that defines the duration of the gate-on voltage $V_{on}$.

The data control signals CONT2 may include a horizontal synchronizing start signal STH that informs or marks the beginning or start of data transmission, a load signal LOAD that instructs the application of the data voltages to the data lines $D_1$-$D_m$, a reverse signal RVS that reverses the polarity of the data voltages with respect to the common voltage $V_{com}$, and a data clock signal HCLK.

In response to the data control signals CONT2 from the signal controller 600, the data driver 500 successively receives the image data DAT for a row of the pixels from the signal controller 600, shifts the image data DAT, converts the image data DAT into analog data voltages selected from the gray voltages from the gray voltage generator 800, and then applies the data voltages to data lines $D_1$-$D_m$.

The gate driver 400 applies the gate-on voltage Von to the gate lines $G_1$-$G_n$ in response to the gate control signals CONT1 from the signal controller 600, thereby turning on the switching elements Q connected thereto. The data voltages applied to the data lines $G_1$-$G_n$ are applied to the corresponding pixel through the activated switching elements Q.

The difference between the data voltage applied to the pixel and the common voltage $V_{com}$ is represented as a voltage across the LC capacitor $C_{LC}$, namely, a pixel voltage. The orientation of LC molecules in the LC capacitor $C_{LC}$ changes depending on the magnitude of the pixel voltage.

The light source driver 920 controls the current applied to the light source section 910 for switching the LED 344 of the light source section 910, and also controls the brightness of the light emitted from the LED 344.

When the light emitted from the LED 344 passes through the LC layer 3, the polarization of the light varies according to the orientations of the LC molecules. The polarizer converts the difference of the light polarization into a difference of the light transmittance.

By repeating this procedure for each unit of the horizontal period (which is denoted by "1H" and is equal to one period of the horizontal synchronizing signal $H_{sync}$, the data enable signal DE, and the gate clock CPV), all of the gate lines $G_1$-$G_n$ are sequentially supplied with the gate-on voltage $V_{on}$ during a frame, thereby applying the data voltages to all of the pixels. When the next frame starts after finishing one frame, the reverse control signal RVS is applied to the data driver 500 and reverses the polarity of the data voltages with respect to the polarity of the previous frame (which is referred to as "frame inversion"). The reverse control signal RVS may reverse the polarity of the data voltages flowing along a data line in one frame (for example, line inversion and dot inversion), or the reverse controls signal RVS may reverse the polarity of the data voltages in one packet (for example, column inversion and dot inversion).

The light source section 910, namely, the LED used in the backlight according to an embodiment of the invention, is described below in detail with reference to FIG. 4.

Figure 4:
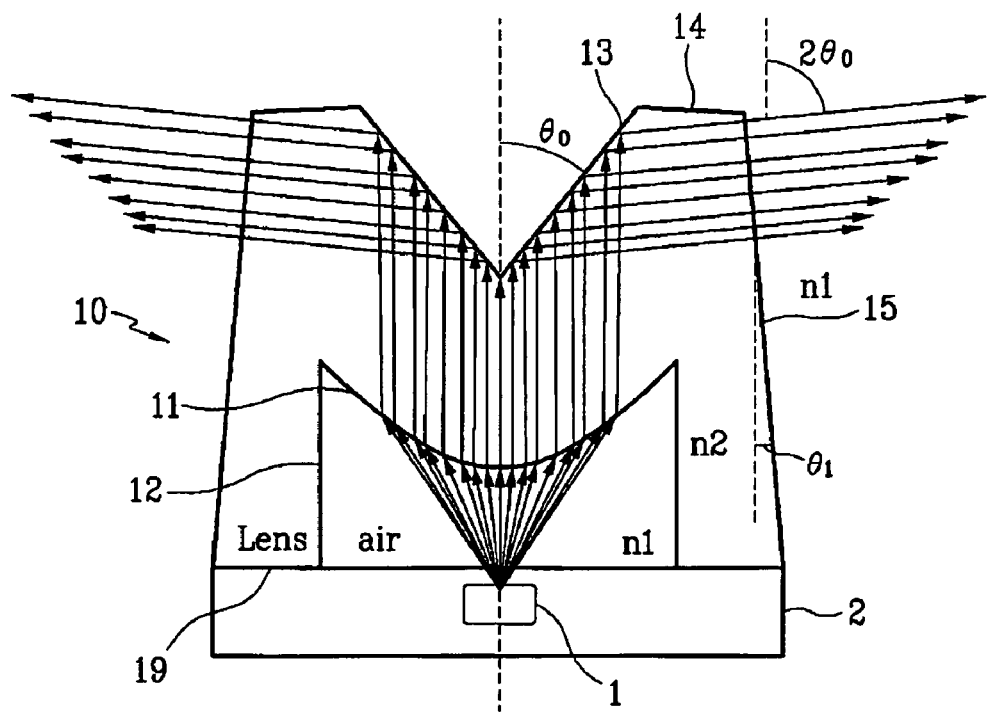
FIG. 4 is a cross-sectional view of an LED according to an embodiment of the invention.

FIG. 4 is a cross-sectional view of an LED according to an embodiment of the invention. Referring to FIG. 4, an LED 344 includes an LED chip 1, a chip base 2, and a lens 10.

The lens 10 has a central cavity or hollow portion therein. The cavity results from attaching a bottom 19 of the lens 10, of which a central portion is hollowed, to the chip base 2. The lens 10 is made of a transparent dielectric material and includes: a bottom portion 19; a substantially cylindrical outer sidewall 15 upwardly extending from the bottom 19; a substantially ring or disk-shaped outer top surface 14 extending from the cylindrical outer sidewall 15; a centermost outer top surface 13 extending from the outer top surface 14 and substantially shaped like a conical groove: a substantially cylindrical inner sidewall 12 extending from the bottom 19 and delimiting a side of the central cavity; and an inner top surface 11 extending from the inner sidewall 12 to delimit a ceiling of the central cavity and having a shape of a convex lens toward the LED chip 1.

The LED chip 1 is mounted or attached in the chip base 2 to be substantially concentric with the lens 10.

The light emitted from the LED chip 1 spreads into the central cavity and is refracted by the inner top surface 11, which converts the light to a parallel light. The parallel light proceeds straight into the lens 10 and is totally-reflected by the centermost outer top surface 13 toward the outer sidewall 15. The parallel light exits the outer sidewall 15 toward the outside of the lens 10. For example, the outer sidewall 15 may be substantially perpendicular to a proceeding direction of the light to minimize light loss based on Fresnel's reflection.

In order for the inner top surface 11 to convert the light emitted from the LED chip 1 to the parallel light, the LED chip 1 should be placed at a focus f of the inner top surface 11, and the following equation (1) relating to the focus f and the radius of curvature R for the inner top surface 11 should be satisfied.

$$f = R \times n_1/(n_2 - n_1) \qquad \text{(Equation 1)}$$

where $n_1$ is a refraction index of air and $n_2$ is a refraction index of a formation material of the lens 10.

In this embodiment only a condition for converting the light emitted from the LED chip 1 to the parallel proceeding light by refraction at the inner top surface 11 is discussed. The above equation may be changed by adjusting the focus f and the radius of curvature R for the inner top surface 11, or the distance between the inner top surface 11 and the LED chip 1, etc., to obtain light that gathers toward a focus away from the centermost outer top surface 13 or which is emitted from a virtual focus away from the LED chip 1. Nevertheless, it is preferable to set up the condition so that the light refracted at the inner top surface 11 meets the centermost outer top surface 13.

A condition where the centermost outer top surface 13 returns the parallel incident light from the inner top surface 11 by the total internal reflection is discussed below.

An angle $\theta_0$ formed between the centermost outer top surface 13 and the main axis of the lens 10 may be satisfied with the following equation (2).

$$\theta_0 \leq 90° - \sin^{-1}(n_1/n_2) \quad \text{(Equation 2)}$$

According to an embodiment of the invention, the following values may be substituted in Equation 2: $n_1$ (refraction index of air) is about 1 and $n_2$ is about 1.5 when the lens is formed with glass. Accordingly, $\theta_0$ is less than or equal to about 49 degrees, preferably about 40°.

In this case, the angle $\theta_0$ formed between the centermost outer top surface 13 and the main axis of the lens 10 may vary depending on a shape of the incident light from the inner top surface 11. For example, because the light is generally condensed, the angle $\theta_0$ should be reduced to a smaller range than that of Equation 2 when given the dispersing light, so it should be enlarged to the larger range.

In order that the light reflected by the centermost outer top surface 13 perpendicularly pass through the cylindrical outer sidewall 15, an angle $\theta_1$ formed between the outer sidewall 15 and the main axis of the lens 10 must be approximately $90° - 2\theta_0$. For example, $\theta_1$ is 10° when $\theta_0$ is 40°.

In the above embodiment, the angle $\theta_1$ may be controlled depending on $\theta_0$ and a shape of the incident light. When the light is input to the outer sidewall 15 at the incident angle of 33° and below, Fresnel's reflection is small. Accordingly, the output direction of the light may be controlled by controlling the angle $\theta_1$ without much loss of light. Accordingly, the angle $\theta_1$ may be adjusted within the range satisfying the following equation (3).

$$57° - 2\theta_0 \leq \theta_1 \leq 123° - 2\theta_0 \quad \text{(Equation 3)}$$

The lens 10 constructed according to the above equation may efficiently disperse the light emitted from the LED chip 1 toward the side of the lens 10. The light dispersed to the side of the lens 10 may be incident upon a light guiding plate 342 or may be reflected upon a reflecting plate 341, thereby dispersing the light to a wide region.

Figure 5:
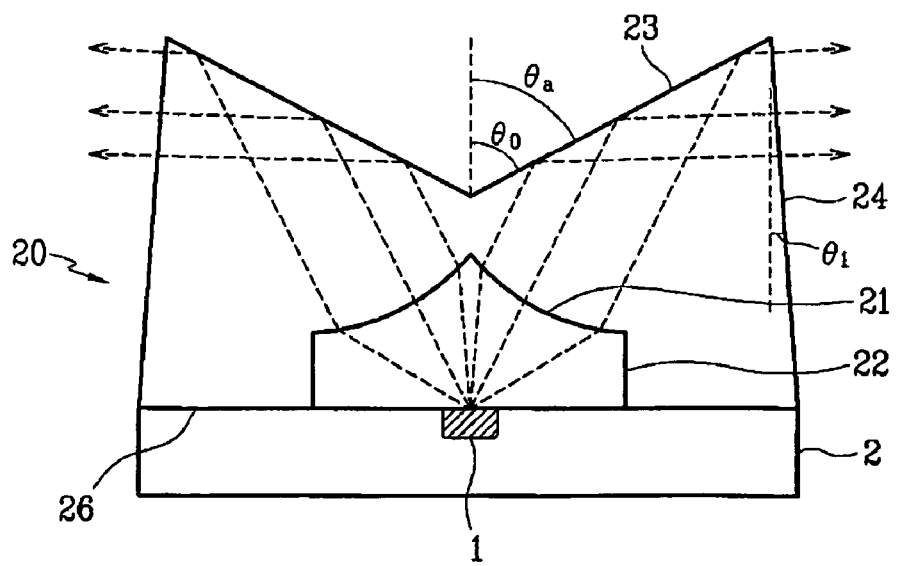
FIG. 5 is a cross-sectional view of an LED according to another embodiment of the invention.

FIG. 5 is a cross-sectional view of an LED according to another embodiment of the invention. Referring to FIG. 5, an LED 344 includes an LED chip 1, a chip base 2, and a lens 20.

The lens 20 has a central cavity area. The cavity results from attaching a bottom 26 of the lens 10, of which a central portion is hollow, with the chip base 2. The lens 20 is made of a dielectric material and includes: a bottom 26; a cylindrical outer sidewall 24 upwardly extending from the bottom 26; a outer top surface 23 extending from the outer sidewall 24 and formed like a substantially cone-shaped groove hollowed toward the central cavity; a substantially cylindrical inner sidewall 22 extending from the bottom 26 and delimiting a side of the central cavity; and an inner top surface 21 extending from the inner sidewall 22 and delimiting a ceiling of the central cavity. The inner top surface 21 may be a cone-like shape that rounds or curves smoothly toward its main axis. It has a shape of a cone of which a side thereof swells slightly toward the LED chip 1.

The LED chip 1 is mounted or attached on the chip base 2 to be substantially concentric with the lens 20.

The light emitted from the LED chip 1 spreads into the central cavity and proceeds toward the outer top surface 23 after being refracted by the inner top surface 21. After refraction by the inner top surface 21, the light has a wave surface having a cone-like shape where an angular point is cut off or removed and the radius increases closer to the outer top surface 23. In FIG. 5 which is a cross-sectional view, such a light is expressed as two groups of parallel light proceeding in different directions.

After attaching the outer top surface 23, the light is directed toward the cylindrical outer sidewall 24 by the total internal reflection. The parallel light then exits the outer sidewall 24 toward the outside of the lens 20. For example, the outer sidewall 24 may be perpendicular to the proceeding direction of the light to minimize the light loss based on Fresnel's reflection.

The discussion below only refers to the embodiment shown in FIG. 5.

When converting the light emitted from the LED chip 1 to two groups of parallel light at the inner top surface 21 through refraction, the LED chip 1 should be placed at a focus f of two convex lines (in a cross-section) of the inner top surface 21, and may be constructed to satisfy the equation (1) relating to the focus f and the radius of curvature R for two convex lines of the inner top surface 21.

In this embodiment, only a condition for converting the light refracted by the inner top surface 21 to the two groups of the parallel proceeding light is discussed. However, to obtain the light which gathers toward a focus away from the outer top surface 23 or which is emitted from a virtual focus away from the LED chip 1, the above condition may be varied by adjusting the focus f and the radius of curvature R for the inner top surface 21, or the distance between the inner top surface 21 and the LED chip 1, etc. Nevertheless, the condition may be set so that the light refracted at the inner top surface 21 meets the outer top surface 23.

In the above described embodiment, the condition that the outer top surface 23 returns the parallel incident light from the inner top surface 21 by the total internal reflection is discussed below.

An angle $\theta_0$ formed between the outer top surface 23 and the main axis of the lens 20 should be satisfied with the following equation (4).

$$\theta_0 \leq \theta_a + 90° - \sin^{-1}(n_1/n_2) \quad \text{(Equation 4)}$$

In Equation 4, $\theta_a$ is an angle formed between a proceeding direction of the light refracted by the inner top surface 21 and the main axis of the lens 20.

The angle $\theta_0$ formed between the outer top surface 23 and the main axis of the lens 20 may vary depending on a shape of the incident light from the inner top surface 21. That is, given that the light is generally condensed, the angle $\theta_0$ should be reduced to a smaller range than that of Equation 4 when given the dispersing light, and be enlarged in the larger range.

In order that the light reflected by the outer top surface 23 perpendicularly pass through the outer sidewall 24, an angle $\theta_1$ formed between the outer sidewall 24 and the main axis of the lens 20 may be approximately $90° + \theta_a - 2\theta_0$.

In this structure, the angle $\theta_1$ may be controlled depending on a shape of the incident light. When the light is input to the outer sidewall 24 at the incident angle of less that or equal to 33°, the proceeding direction of the light may be controlled by controlling the angle $\theta_1$ within such a range since Fresnel's reflection is small. Accordingly, the angle $\theta_1$ may be adjusted within the range to satisfy the following equation (5):

$$57° + \theta_a - 2\theta_0 \leq \theta_1 \leq 123° + \theta_a - 2\theta_0. \quad \text{Equation 5}$$

Figure 6:
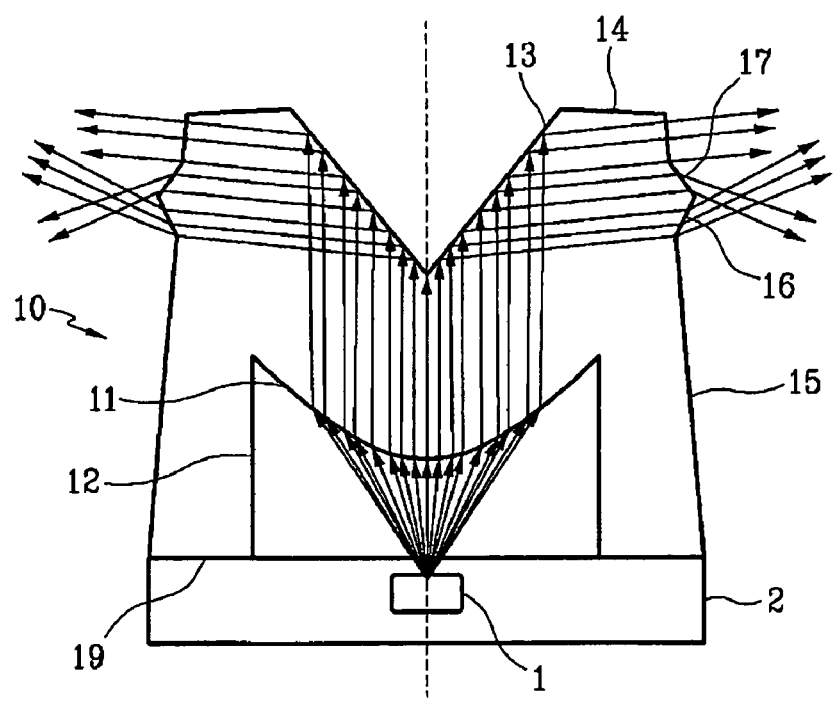
FIG. 6 is a cross-sectional view of an LED according to another embodiment of the invention.

FIG. 6 is a cross-sectional view of an LED according to another embodiment of the invention.

The LED may include a protrusion formed on the cylindrical outer sidewall 15 of the lens 10, which is different from FIG. 4. The protrusion may freely change the proceeding direction of the light. This protrusion includes of two slant surfaces 16 and 17, each of the slant surfaces having a slant different from the outer sidewall 15. As shown in FIG. 6, the light passing through the protrusion is refracted in a direction different from the light refracted at the rest outer sidewall 15 without the protrusion.

In this way, such a protrusion enables the light-proceeding direction to be varied, promoting uniform light distribution.

Another method for varying the light-proceeding direction may be used, such as forming a groove at the cylindrical outer surface 15 instead of the protrusion. It is understood that the number of grooves or protrusions may be controlled, as necessary.

Figure 7:
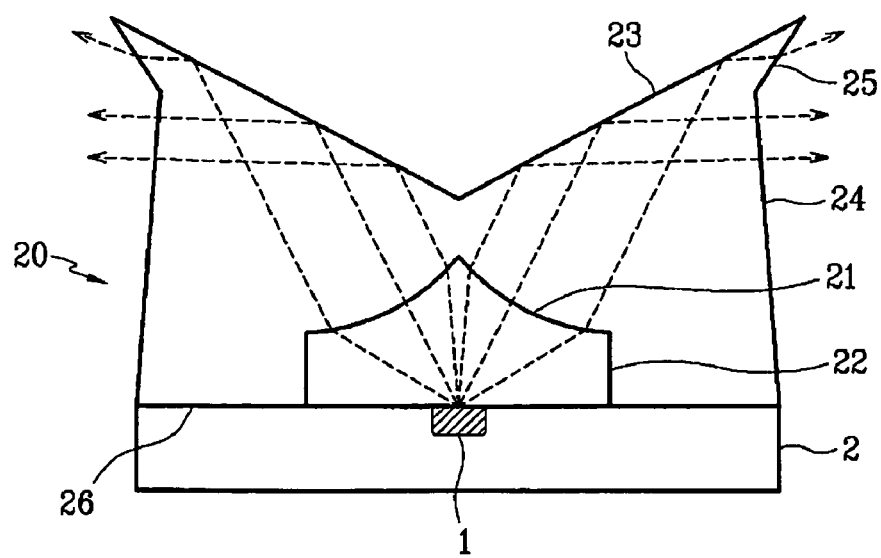
FIG. 7 is a cross-sectional view of an LED according to another embodiment of the invention.

FIG. 7 is a cross-sectional view of an LED according to another embodiment of the invention.

The LED may further include a protrusion formed at or near the cylindrical outer sidewall 24 of the lens 20, which is different from FIG. 5. The protrusion may freely change the proceeding direction of the light. This protrusion includes a slant surface 25 having a different slant from the outer sidewall 24. As shown in FIG. 7, the light passing through the slant surface 25 is refracted in a different direction from the light refracted at the rest outer sidewall 24 without the protrusion.

In this way, such a protrusion may vary the light-proceeding direction, which improves uniform light distribution.

Another method for varying the light-proceeding direction may be used, such as forming a groove at or near the cylindrical outer sidewall 24 instead of the protrusion. It is understood that, the number of grooves or protrusions may be controlled, as necessary.

Figure 8:
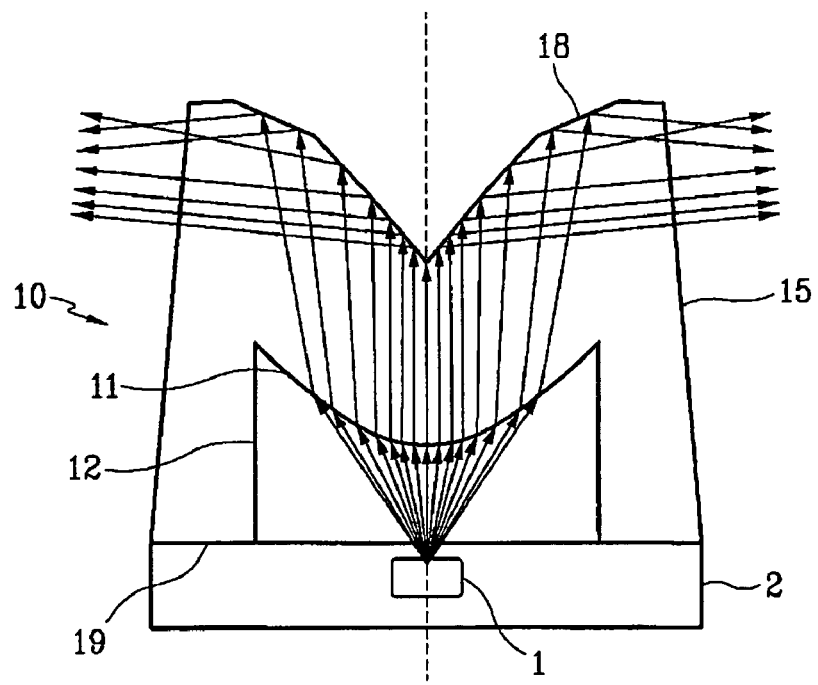
FIG. 8 is a cross-sectional view of an LED according to another embodiment of the invention.

FIG. 8 is a cross-sectional view of an LED according to another embodiment of the invention.

The LED may include a centermost outer top surface 18 having an irregular slant, which is different from FIG. 4. The slant of the centermost outer top surface 18 may decrease in a direction away from the main axis of the lens 10.

Due to such a formed centermost top surface 18, the light may be total-reflected at diverse angles. As a result, when the light exits the outer sidewall 15, its proceeding direction becomes diverse.

In FIG. 8, the light refracted at the inner top surface 11 is shown as being diffused from a virtual focus near the LED chip 1, however, it is understood that the light may be parallel light or condensed light.

Figure 9:
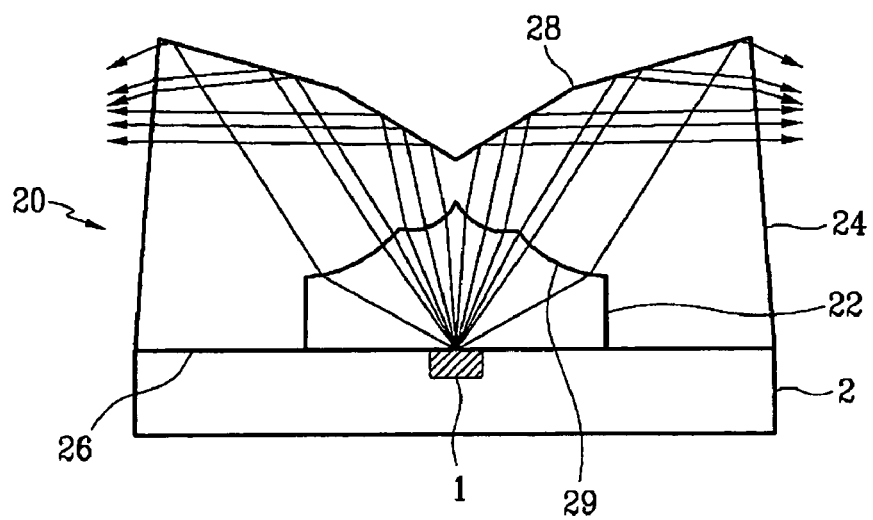
FIG. 9 is a cross-sectional view of an LED according to another embodiment of the invention.

FIG. 9 is a cross-sectional view of an LED according to another embodiment of the invention.

The LED may include an inner top surface 29 having several convex surfaces toward the LED chip, and the top surface 28 that is divided into two parts having different slants, which is different from FIG. 5.

The configured lens 20 may vary the light-proceeding direction to, which improves uniform light distribution.

As described above, the LED of the present invention is configured to efficiently control the light-proceeding direction. Due to such an LED, the RGB mixing area for producing the white light and the uniform dispersion area for emitting the uniform surface light are reduced in the backlight, facilitating the fabrication of compact, slim, and light LCDs.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A lens for a light emitting diode, comprising:
   a substantially flat bottom surface;
   an outer sidewall extending obliquely from the bottom surface;
   a first outer top surface extending from the outer sidewall;
   a second outer top surface extending from the first outer top surface and comprising a substantially conical groove-like shape;
   an inner sidewall forming a side of a cavity; and
   an inner top surface extending from the inner sidewall and forming a ceiling for the cavity,
   wherein the second outer top surface has an angular point that points toward the cavity and the inner top surface is convexly formed toward the bottom surface, and at least a portion of the outer sidewall forms an acute angle with the bottom surface.

2. The lens of claim 1, wherein both the outer sidewall and the inner sidewall have a substantially cylindrical shape.

3. The lens of claim 2, wherein the lens satisfies the following equation:

$$f = R \times n_1 / (n_2 - n_1)$$

where $n_1$ is a refraction index of air, $n_2$ is a refraction index of a material comprising the lens, $f$ is a focus of the inner top surface, and R is a radius of curvature for the inner top surface.

4. The lens of claim 3, wherein the lens satisfies the following equation:

$$\theta_0 \leq 90° - \sin^{-1}(n_1/n_2)$$

where $\theta_0$ is an angle formed between the second outer top surface and a main axis of the lens.

5. The lens of claim 4, wherein the lens satisfies the following equation:

$$57° - 2\theta_0 \leq \theta_1 \leq 123° - 2\theta_0$$

where $\theta_1$ is an angle formed between the outer sidewall and the main axis of the lens.

6. The lens of claim 2, wherein the outer sidewall comprises at least two or more portions each having a different slant.

7. The lens of claim 2, wherein the second outer top surface comprises at least two or more portions each having a different slant.

8. A light emitting diode, comprising:
   the lens of claim 1;
   a base coupled with a bottom of the lens; and
   a light emitting chip arranged in the base, the light emitting chip being substantially concentric with the lens.

9. The light emitting diode of claim 8, wherein a shortest distance between the light emitting chip and the inner top surface of the lens is equal to a focus of the inner top surface.

10. The lens of claim 1, wherein the inner sidewall extends parallel to a concentric axis defining the inner top surface and the first and second outer top surfaces.

11. A lens for a light emitting diode, comprising:
    a substantially flat bottom surface;
    an outer sidewall extending obliquely from the bottom surface;
    an outer top surface extending from the outer sidewall and comprising a substantially conical groove like shape:
    an inner sidewall forming a side of a cavity; and an inner top surface extending from the inner sidewall and forming a ceiling for the cavity, wherein the outer top surface has an angular point that points toward the cavity and the inner top surface comprises a substantially cone-like shape convexly formed toward the bottom surface, and at least a portion of the outer sidewall forms an acute angle with the bottom surface.

12. The lens of claim 11, wherein the outer sidewall and the inner sidewall have a substantially cylindrical shape.

13. The lens of claim 12, wherein the lens satisfies the following equation:

$$f = R \times n_1 / (n_2 - n_1)$$

where $n_1$ is a refraction index of air, $n_2$ is a refraction index of a material comprising the lens, f is a focus of two convex lines in a cross-section of the inner top surface, and R is a radius of curvature of the two convex lines.

14. The lens of claim 13, wherein the lens satisfies the following equation:

$$\theta_0 \leq \theta_a + 90° - \sin^{-1}(n_1/n_2)$$

where $\theta_0$ is an angle formed between the outer top surface and the main axis of the lens, $\theta_a$ is an angle formed between a proceeding direction of light refracted by the inner top surface and the main axis of the lens, $n_1$ is a refraction index of air, and $n_2$ is a refraction index of a formation material of the lens.

15. The lens of claim 14, wherein the lens satisfies the following equation:

$$57° + \theta_a - 2\theta_0 \leq \theta_1 \leq 123° + \theta_a - 2\theta_0$$

where $\theta_1$ is an angle formed between the outer sidewall and a main axis of the lens.

16. The lens of claim 12, wherein the outer sidewall comprises at least two or more portions each having a different slant.

17. The lens of claim 12, wherein the outer top surface comprises at least two portions each having a different slant.

18. The lens of claim 12, wherein the inner top surface comprises a plurality of convex portions.

19. A light emitting diode, comprising:
the lens of claim 11;
a base coupled with a bottom of the lens; and
a light emitting chip arranged in the base, the light emitting chip being substantially concentric with the lens.

20. The light emitting diode of claim 19, wherein a shortest distance between the light emitting chip and the inner top surface of the lens is equal to a focus of two convex lines in a cross-section of the inner top surface.

21. The lens of claim 11, wherein the inner sidewall extends parallel to a concentric axis defining the inner top surface and the first and second outer top surfaces.

* * * * *